United States Patent
Kitada

(10) Patent No.: US 8,348,395 B2
(45) Date of Patent: Jan. 8, 2013

(54) PIEZOELECTRIC ELEMENT, LIQUID EJECTION HEAD, AND LIQUID EJECTING APPARATUS

(75) Inventor: Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 97 days.

(21) Appl. No.: 13/085,896

(22) Filed: Apr. 13, 2011

(65) Prior Publication Data

US 2011/0267405 A1   Nov. 3, 2011

(30) Foreign Application Priority Data

Apr. 30, 2010 (JP) .................................. 2010-104916

(51) Int. Cl.
  *B41J 2/045*   (2006.01)
  *H01L 41/18*   (2006.01)
  *H01L 41/187*   (2006.01)
  *C04B 35/495*   (2006.01)
  *C04B 35/00*   (2006.01)

(52) U.S. Cl. ...................... 347/68; 310/311; 252/62.9 R; 252/62.9 PZ

(58) Field of Classification Search .................... 347/68, 347/70, 72; 252/62.9 PZ, 62.9 R
See application file for complete search history.

(56) References Cited

U.S. PATENT DOCUMENTS
6,461,532 B1 * 10/2002 Oka et al. ................. 252/62.9 R

FOREIGN PATENT DOCUMENTS
JP       2009-231482 A   10/2009

* cited by examiner

*Primary Examiner* — Matthew Luu
*Assistant Examiner* — Lisa M Solomon
(74) *Attorney, Agent, or Firm* — Workman Nydegger

(57) ABSTRACT

A piezoelectric element, comprising electrodes and a piezoelectric body formed between the electrodes. The piezoelectric body consists of a perovskite oxide including bismuth, lantern, iron and manganese. The molar ratio of the sum of the bismuth and the lantern to the sum of the iron and the manganese is 0.87 or more and 0.94 or less. The molor ratio of the bismuth to the lantern is 3.57 or more and 4.82 or less.

4 Claims, 5 Drawing Sheets

PIEZOELECTRIC ELEMENT, LIQUID EJECTION HEAD, AND LIQUID EJECTING APPARATUS

CROSS-REFERENCE TO RELATED APPLICATIONS

This application claims the benefit of priority to Japanese Patent Application No. 2010-104916 filed Apr. 30, 2010, the contents of which are hereby incorporated by reference in their entirety.

BACKGROUND

1. Technical Field

The present invention relates to a liquid ejection head, a piezoelectric element, a piezoelectric actuator, and a liquid ejecting apparatus.

2. Related Art

The liquid ejection head is used for, for example, an ink jet printer and the like as a component of a liquid ejecting apparatus. In this case, the liquid ejection head is used for ejecting and flying small ink droplets. This makes it possible for an ink jet printer to perform printing by attaching the ink to a medium, such as paper.

In general, the liquid ejection head has an actuator that applies pressure to liquid in order to eject the liquid from a nozzle. Mentioned as such an actuator is one having a piezoelectric element, for example. Mentioned as the piezoelectric element of the actuator is one having a structure in which a piezoelectric material demonstrating an electromechanical conversion function, e.g., a piezoelectric body containing crystallized piezoelectric ceramics, is sandwiched between two electrodes. Such a piezoelectric element can be transformed by the application of a voltage by the two electrodes, and the actuator can be operated in a bending vibration mode, for example, utilizing the transformation.

As the piezoelectric material for use in such an application, the piezoelectric properties, such as electromechanical conversion efficiency, are preferably high. Since the properties are excellent as compared with other materials, lead zirconate titanate (PZT) materials have been researched and developed. In recent years, however, the use of materials with a lower environmental load has been demanded. Thus, the development of, for example, a piezoelectric material of a perovskite oxide with a small lead content has been advanced.

Mentioned as ceramic materials having theoretically high piezoelectric properties are Bi oxides, for example, and, $BiFeO_3$ (BFO) is considered as the most promising candidate for the materials under the present circumstances.

However, BFO has a problem in that the insulation properties are low and the leakage current is high. Moreover, BFO also has a problem in that high voltage resistance is required because the coercive electric field is high and a high voltage needs to be applied for driving when used as a piezoelectric body.

Therefore, a BFO material in which a leakage current is suppressed by replacing some elements constituting the BFO has been proposed in, for example, JP-A-2009-231482.

SUMMARY

An advantage of some aspects of the invention is to provide a liquid ejection head, a piezoelectric element, a piezoelectric actuator, and a liquid ejecting apparatus each containing a piezoelectric body in which the voltage resistance becomes favorable.

(1) A liquid ejection head according to the present invention is a liquid ejection head having a piezoelectric body and a piezoelectric actuator containing an electrode that applies a voltage to the piezoelectric body, in which the piezoelectric body is bismuth lantern ferrite manganate, and in the bismuth lantern ferrite manganate, the ratio of the sum of the mol number of bismuth and the mol number of lantern to the sum of the mol number of iron and the mol number of manganese is 0.87 or more and 0.94 or lower, and the ratio of the mol number of bismuth to the mol number of lantern is 3.57 or more and 4.82 or lower.

According to the invention, a liquid ejection head containing a piezoelectric body in which the voltage resistance becomes favorable can be achieved.

(2) In the liquid ejection head, the ratio of the mol number of manganese to the sum of the mol number of iron and the mol number of manganese in the bismuth lantern ferrite manganate may be 0.02 or more and 0.04 or lower.

Thus, a liquid ejection head containing a piezoelectric body in which the voltage resistance becomes favorable can be achieved.

(3) A piezoelectric element according to the invention contains a pair of conductive layers disposed facing each other; and a piezoelectric body disposed between the pair of conductive layers, in which the piezoelectric body is bismuth lantern ferrite manganate, and in the bismuth lantern ferrite manganate, the ratio of the sum of the mol number of bismuth and the mol number of lantern to the sum of the mol number of iron and the mol number of manganese is 0.87 or more and 0.94 or lower, and the ratio of the mol number of bismuth to the mol number of lantern is 3.57 or more and 4.82 or lower.

According to the invention, a piezoelectric element containing a piezoelectric body in which the voltage resistance becomes favorable can be achieved.

(4) A piezoelectric actuator according to the invention contains the piezoelectric element; and an elastic member that is transformed by the piezoelectric element.

According to the invention, a piezoelectric actuator containing a piezoelectric body in which the voltage resistance becomes favorable can be achieved.

(5) A liquid ejecting apparatus according to the invention has the liquid ejection head according to any one of the above-described aspects.

According to the invention, a liquid ejecting apparatus containing a piezoelectric body in which the voltage resistance becomes favorable can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described in detail with reference to the drawings. The embodiments described below do not unfairly limit the contents of the invention described in Claims. All the structures described below are not necessarily indispensable constituent elements of the invention.

1. Piezoelectric Element and Piezoelectric Actuator

Figure 1:
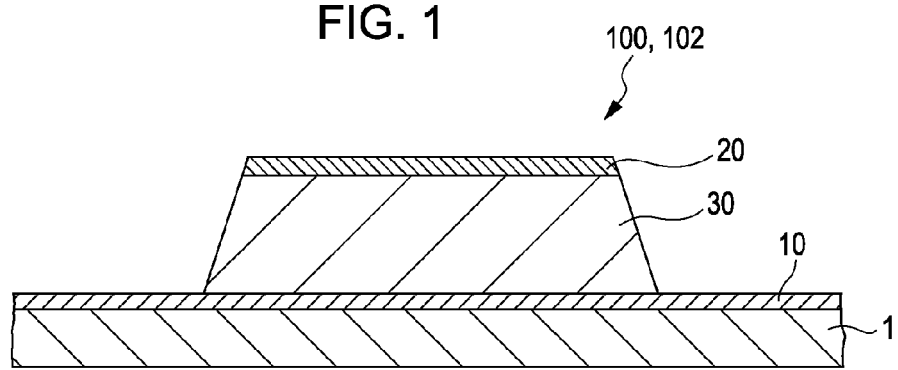
FIG. 1 is a schematic view of the cross section of a piezoelectric element according to this embodiment.

FIG. 1 is a schematic view of the cross section of a piezoelectric element 100 according to this embodiment.

The piezoelectric element 100 according to this embodiment contains a first conductive layer 10, a second conductive layer 20, and a piezoelectric body 30.

1.1. First Conductive Layer

The first conductive layer 10 is formed on a substrate 1, for example. The substrate 1 can be a plate formed with a conductor, a semiconductor, or an insulator, for example. The substrate 1 may be a single layer or a laminate of two or more layers. The substrate 1 is not limited in the internal structure insofar as the top surface is a planar shape. For example, a structure in which a space or the like is formed thereinside may be acceptable. Moreover, when a pressure chamber or the like is formed under the substrate 1 as in, for example, a liquid ejection head described later, two or more structures formed below the substrate 1 may be collectively defined as one substrate 1.

The substrate 1 may be an elastic member (diaphragm) that has flexibility and can be transformed (bent) by the operation of the piezoelectric body 30. In this case, the piezoelectric element 100 serves as a piezoelectric actuator 102 containing the elastic member (diaphragm), the first conductive layer 20, the piezoelectric body 30, and the second conductive layer 20. Here, the fact that the substrate 1 has flexibility refers to the fact that the substrate 1 can bend. When the substrate 1 is an elastic member (diaphragm), the substrate 1 may bend in such a manner as to change the capacity of the pressure chamber to the same extent as the volume of liquid to be ejected when the piezoelectric actuator 102 is used for a liquid ejection head.

When the substrate 1 is the elastic member (diaphragm), examples of materials of the substrate 1 include inorganic oxides, such as the zirconium oxide ($ZrO_2$), silicon nitride, and silicon oxide and alloys, such as stainless steel. Among the above, as the materials of the elastic member (diaphragm), zirconium dioxide is preferable in terms of chemical stability and rigidity. Also in this case, the substrate 1 may be a laminated structure of two or more kinds of the substances mentioned above.

Hereinafter, this embodiment describes the case where the substrate 1 is the elastic member (diaphragm) and is formed with zirconium dioxide. Therefore, the piezoelectric element 100 is substantially the same as the piezoelectric actuator 102 having the elastic member (diaphragm) that has flexibility and can be transformed (bent) by the operation of the piezoelectric body 30. In the following description, the piezoelectric element 100 and the piezoelectric actuator 102 can be replaced by each other.

The shape of the first conductive layer 10 is not limited insofar as the first conductive layer 10 can face the second conductive layer 20. In this embodiment, however, since the piezoelectric body 30 is formed into a thin film, the shape is preferably a layer shape or a thin film shape. The thickness of the first conductive layer 10 can be 50 nm or more and 300 nm or lower, for example. Moreover, the planar shape of the first conductive layer 10 is not particularly limited insofar as the piezoelectric body 30 can be disposed between the first conductive layer 10 and the second conductive layer 20 when the first conductive layer 10 is disposed facing the second conductive layer 20 and, for example, a rectangular shape, a circular shape, or the like can be accepted.

As one of the functions of the first conductive layer 10, the first conductive layer 10 forms one pair with the second conductive layer 20 to serve as one electrode (e.g., lower electrode formed under the piezoelectric body 30) for applying a voltage to the piezoelectric body 30, for example. The first conductive layer 10 may be provided with a function of controlling the crystal orientation when crystallizing the piezoelectric body 30.

Mentioned as materials of the first conductive layer 10 are various metals, such as nickel, iridium, and platinum, conductive oxides thereof (e.g., iridium oxide), a complex oxide of strontium and ruthenium ($SrRuO_x$:SRO), a complex oxide of lantern and nickel ($LaNiO_x$:LNO), and the like. The first conductive layer 10 may be a single layer structure of the materials mentioned above or a laminated structure of two or more kinds of the materials.

1.2. Second Conductive Layer

The second conductive layer 20 is disposed facing the first conductive layer 10. The second conductive layer 20 may entirely face the first conductive layer 10 or partially face the first conductive layer 10. The shape of the second conductive layer 20 is not limited insofar as the second conductive layer 20 can face the first conductive layer 10. In this embodiment, however, since the piezoelectric body 30 is formed into a thin film, the shape is preferably a layer shape or a thin film shape. The thickness of the second conductive layer 20 can be 50 nm or more and 300 nm or lower, for example. Moreover, the planar shape of the second conductive layer 20 is not particularly limited insofar as the piezoelectric body 30 can be disposed between the first conductive layer 10 and the second conductive layer 20 when the second conductive layer 20 is disposed facing the first conductive layer 10 and, for example, a rectangular shape, a circular shape, or the like can be accepted.

As one of the functions of the second conductive layer 20, the second conductive layer 20 serves as one electrode (e.g., upper electrode formed on the piezoelectric body 30) for applying a voltage to the piezoelectric body 30, for example. The second conductive layer 20 may be provided with a function of controlling the crystal orientation when crystallizing the piezoelectric body 30. Materials of the second conductive layer 20 can be the same as those of the first conductive layer 10.

FIG. 1 illustrates an example in which the first conductive layer 10 is formed to be two-dimensionally larger than the second conductive layer 20. However, the second conductive layer 20 may be formed to be two-dimensionally larger than the first conductive layer 10. In this case, the second conductive layer 20 may be formed on the side surface of the piezoelectric body 30, so that the second conductive layer 20 can be provided with a function of protecting the piezoelectric body 30 from moisture, hydrogen, and the like.

1.3. Piezoelectric Body

The piezoelectric body 30 is disposed between the first conductive layer 10 and the second conductive layer 20. The piezoelectric body 30 may contact at least one of the first conductive layer 10 and the second conductive layer 20. In the example of FIG. 1, the piezoelectric body 30 is provided in contact with the first conductive layer 20 and the second conductive layer 20.

The piezoelectric body 30 may be formed by a thin film method. The thin film method may be, for example, at least one of a sputtering method, a vapor deposition method, an MOCVD (Metal-Organic Chemical Vapor Deposition) method, an MOD (Metal-Organic Decomposition) method, a PLD (Pulsed Laser Deposition) method (a laser ablation method), a mist film forming method, and a sol gel method. The piezoelectric body 30 of this embodiment may be formed in a bulk state.

The thickness of the piezoelectric body 30 is not particularly limited and can be, for example, 100 nm or more and 3000 nm or lower. In forming the piezoelectric body 30 having a large thickness by a thin film method, the piezoelectric body 30 can be formed by prolonging the deposition time in methods including depositing substances, such as a sputtering method, a vapor deposition method, or an MOCVD method. Or, in methods including performing coating and firing, such as an MOD method or a sol gel method, the piezoelectric body 30 can be formed by laminating layers by repeating the method. When laminating, the layers may be laminated using different thin film methods for each layer. When the thickness of the piezoelectric body 30 deviates from the range above, the resistance to pressure becomes insufficient or sufficient transformation (electromechanical conversion) cannot be achieved in some cases.

The piezoelectric body 30 of this embodiment is bismuth lantern ferrite manganate.

More specifically, the piezoelectric body 30 is bismuth lantern ferrite manganate (hereinafter sometimes abbreviated as "BLFM") and can be represented as Formula (I) shown below, for example.

$$(Bi_w,La_x)(Fe_y,Mn_z)O_3 \qquad (I)$$

The BLFM is a complex oxide represented by $ABO_3$ as a general formula, is classified into a so-called perovskite oxide, and can take a perovskite crystal structure by crystallization. The BLFM can demonstrate piezoelectricity when crystallized to take a perovskite crystal structure. Thus, the piezoelectric body 30 can be transformed (electromechanical conversion) by the application of an electric field by the first conductive layer 10 and the second conductive layer 20. By the transformation, the substrate 1 can be bent or vibrated, for example, and the piezoelectric actuator 102 can be constituted.

When the piezoelectric body 30 of this embodiment is represented in the form of Formula (I) above, w, x, y, and z each can take the value of 0 or more and 1 or lower. These values may represent the charge amount of raw materials in forming the piezoelectric body 30 or may represent the composition of the piezoelectric body 30 after formation. Therefore, the neutrality of the electrical charge of the chemical formula is not apparently satisfied in some cases. In such a case, a charge value or a degree of crystal defects is represented.

The piezoelectric body 30 of this embodiment is bismuth lantern ferrite manganate, in which the ratio of the sum of the mol number of bismuth and the mol number of lantern to the sum of the mol number of iron and the mol number of manganese is 0.87 or more and 0.94 or lower and the ratio of the mol number of bismuth to the mol number of lantern is 3.57 or more and 4.82 or lower. More specifically, when the piezoelectric body 30 of this embodiment is represented in the form of Formula (I) above, $0.87 \leq (w+x)/(y+z) \leq 0.94$ and $3.57 \leq w/x \leq 4.82$ are established.

In the piezoelectric element 100 of this embodiment, the ratio of the sum of the mol number of bismuth and the mol number of lantern to the sum of the mol number of iron and the mol number of manganese and the ratio of the mol number of bismuth to the mol number of lantern of the piezoelectric body 30 are in this range. Thus, the voltage resistance becomes favorable. Thus, a voltage to be applied to the piezoelectric element 100 can be made high, and, for example, the displacement of the piezoelectric actuator 102 can be increased. Such a piezoelectric body 30 can improve the ink ejection performance in ink jet printing, for example. The ratio of the mol number of bismuth to the mol number of lantern is more preferably 3.57 or more and 3.95 or lower.

In the piezoelectric body 30 of this embodiment, the ratio of the mol number of manganese to the sum of the mol number of iron and the mol number of manganese in the bismuth lantern ferrite manganate may be 0.02 or more and 0.04 or lower. More specifically, when the piezoelectric body 30 of this embodiment is represented in the form of Formula (I) above, $0.02 \leq z/(y+z) \leq 0.04$ can be established. Thus, the voltage resistance of the piezoelectric element 100 becomes favorable.

1.4. Effects and the Like

The piezoelectric element 100 (piezoelectric actuator 102) according to this embodiment contains the piezoelectric body 30 described above, and thus has a characteristic such that at least the voltage resistance, i.e., the electric field strength which causes dielectric breakdown when a voltage is applied between the first conductive layer 10 and the second conductive layer 20, is high. A further description will be given in Examples described later and, in the piezoelectric element 100 of this embodiment, the electric field strength which causes dielectric breakdown is very high and, for example, the piezoelectric element 100 of this embodiment can have a value of 1040 kV/cm.

The piezoelectric element 100 of this embodiment can be used for various applications. Mentioned as the application of the piezoelectric actuator 102 are, for example, a liquid ejection head, a liquid ejecting apparatus of an ink jet printer or the like, and the like. As the application of the piezoelectric element 100, the piezoelectric element 100 can be preferably used for various sensors, such as a gyro sensor and an acceleration sensor, timing devices, such as a tuning fork type resonator, and ultrasonic devices, such as an ultrasonic motor.

2. Method for Manufacturing Piezoelectric Element

The piezoelectric element 100 of the invention can be manufactured as follows, for example.

First, the substrate 1 is prepared, and then the first conductive layer 10 is formed on the substrate 1. The first conductive layer 20 can be formed by a sputtering method, a plating method, a vacuum evaporation method, or the like, for example. The first conductive layer 10 can be patterned as required.

Next, the piezoelectric body 30 is formed on the first conductive layer 20. The piezoelectric body 30 can be formed as described above by, at least one of, for example, a sputtering method, a vapor deposition method, an MOCVD (Metal-Organic Chemical Vapor Deposition) method, an MOD (Metal-Organic Decomposition) method, a PLD (Pulsed Laser Deposition) method (a laser ablation method), a mist film forming method, and a sol gel method or a combination of two or more methods thereof. The crystallization of the piezoelectric body 30 can be performed at a temperature of 500° C. or more and 800° C. or lower in a nitrogen atmosphere, for example. This can crystallize the piezoelectric body 30. The crystallization may be performed after patterning the piezoelectric body 30. Then, the operation above is repeated two or more times as required, thereby obtaining the piezoelectric body 30 of a desired thickness.

Next, the second conductive layer 20 is formed on the piezoelectric body 30. The second conductive layer 20 can be formed by a sputtering method, a plating method, a vacuum evaporation method, or the like, for example. Then, the second conductive layer 20 and the piezoelectric body 30 are patterned into a desired shape to form a piezoelectric element. The second conductive layer 20 and the piezoelectric body 30 can be simultaneously patterned as required. By the processes described above, the piezoelectric element 100 of this embodiment can be manufactured.

3. Liquid Ejection Head

Figure 2:
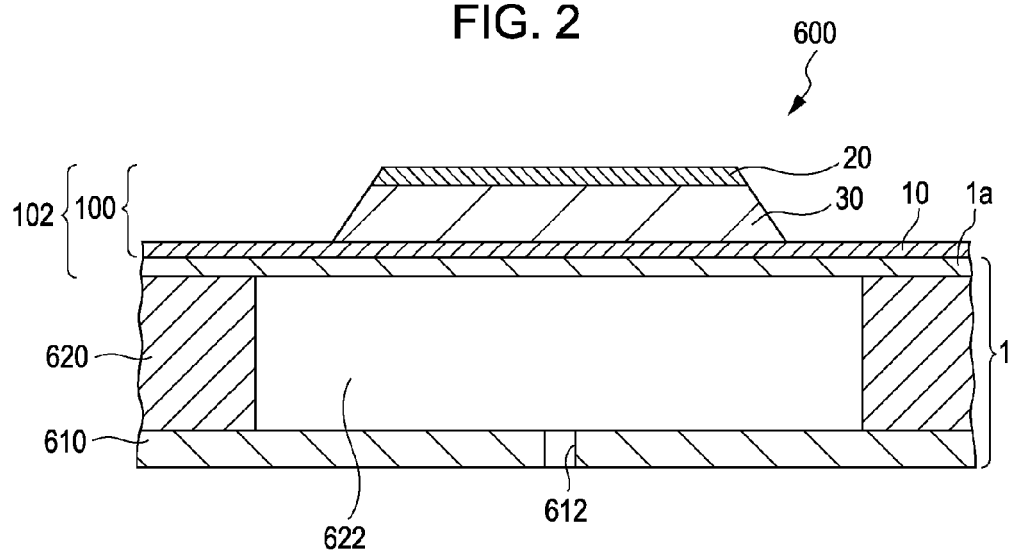
FIG. 2 is a cross sectional view schematically illustrating the principal part of a liquid ejection head according to this embodiment.
Figure 3:
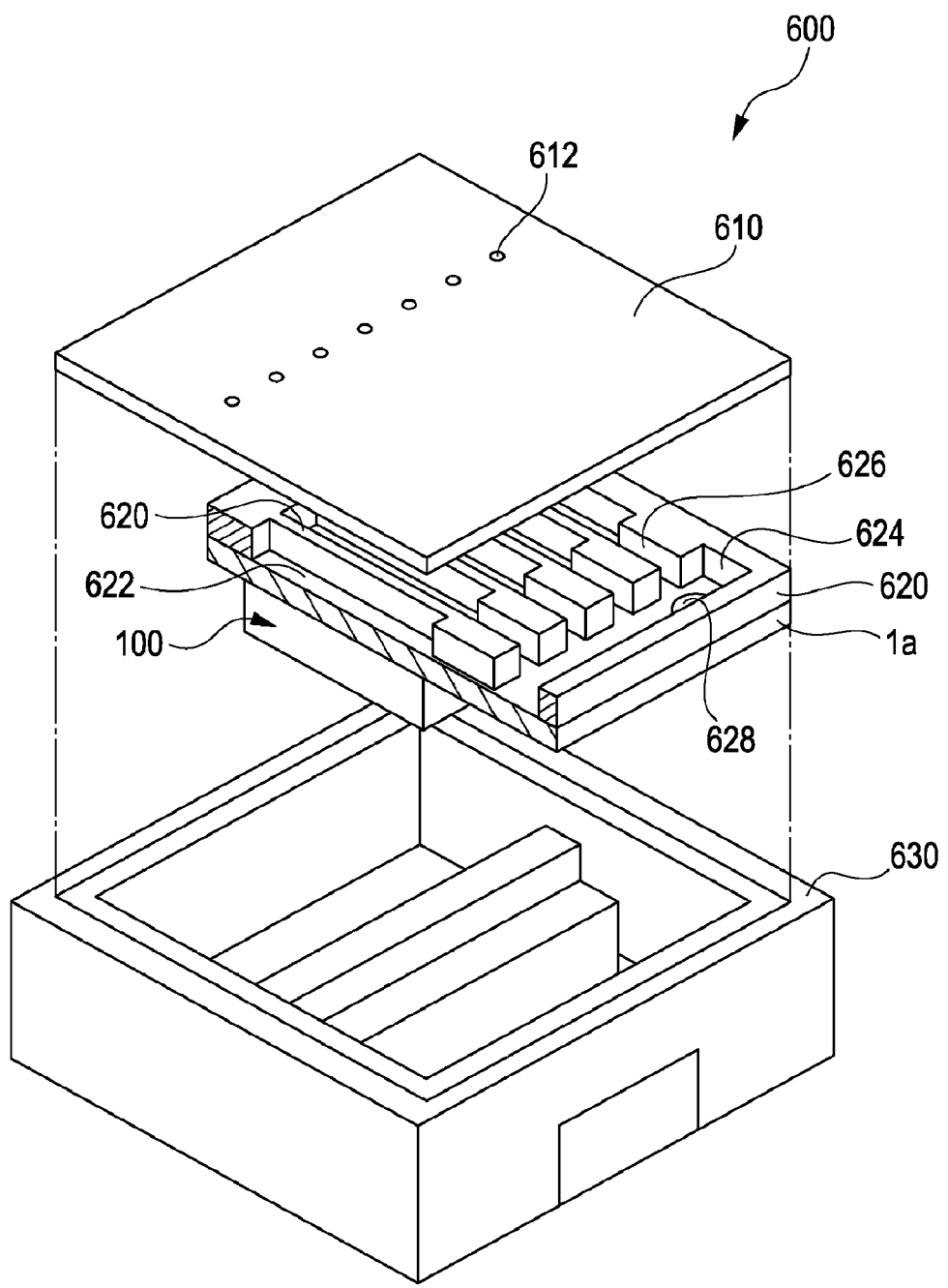
FIG. 3 is an exploded perspective view of the liquid ejection head according to this embodiment.

Next, a liquid ejection head 600 having the piezoelectric element according to this embodiment will be described as an example of the use of the piezoelectric element (piezoelectric actuator) according to this embodiment with reference to the drawings. FIG. 2 is a cross sectional view schematically illustrating the principal part of the liquid ejection head 600 according to this embodiment. FIG. 3 is an exploded perspective view of the liquid ejection head 600 according to this embodiment, in which the liquid ejection head 600 is illustrated upside down relative to the usual use state.

The liquid ejection head 600 can have the above-described piezoelectric element (piezoelectric actuator). In the following description, the liquid ejection head 600 will be described as an example in which the piezoelectric element 100 is formed on the substrate 1 (structure containing a diaphragm 1a on the upper portion) and the piezoelectric element 100 and the diaphragm 1a constitute the piezoelectric actuator 102.

As illustrated in FIGS. 2 and 3, the liquid ejection head 600 contains a nozzle plate 610 having a nozzle opening 612, a pressure chamber substrate 620 for forming a pressure chamber 622, and the piezoelectric element 100. The liquid ejection head 600 can further have a case 630 as illustrated in FIG. 3. FIG. 3 illustrates the piezoelectric element 100 in a simple manner.

The nozzle plate 610 has the nozzle opening 612 as illustrated in FIGS. 2 and 3. From the nozzle opening 612, ink can be ejected. In the nozzle plate 610, a large number of the nozzle openings 612 are provided in one row, for example. Mentioned as materials of the nozzle plate 620 are silicon, stainless steel (SUS), and the like, for example.

The pressure chamber substrate 620 is provided on (under in the example of FIG. 3) the nozzle plate 610. Mentioned as materials of the pressure chamber substrate 620 are silicon and the like, for example. Since the pressure chamber substrate 620 divides the space between the nozzle plate 610 and the diaphragm 1a, a reservoir (liquid storage portion) 624, a supply port 626 communicating with the reservoir 624, and a pressure chamber 622 communicating with the supply port 626 are provided as illustrated in FIG. 3. In this example, the description is given while distinguishing the reservoir 624, the supply port 626, and the pressure chamber 622. However, the reservoir 624, the supply port 626, and the pressure chamber 622 are all flow paths of liquid, and such flow paths may be freely designed. For example, the supply port 626 has a shape in which the flow path is partially narrowed in the example of the drawing but can be arbitrarily formed in accordance with a design and is not necessarily indispensable component. The reservoir 624, the supply port 626, and the pressure chamber 622 are divided by the nozzle plate 610, the pressure chamber substrate 620, and the diaphragm 1a. The reservoir 624 can temporarily store ink to be supplied from the outside (e.g., ink cartridge) through a through hole 628 provided in the diaphragm 1a. The ink in the reservoir 624 can be supplied to the pressure chamber 622 through the supply port 626. The capacity of the pressure chamber 622 changes due to the transformation of the diaphragm 1a. The pressure chamber 622 communicates with the nozzle opening 612. Due to the changes in the capacity of the pressure chamber 622, the ink or the like is ejected from the nozzle opening 612.

The piezoelectric element 100 is provided on (under in the example of FIG. 3) the pressure chamber substrate 620. The piezoelectric element 100 is electrically connected to a piezoelectric element driving circuit (not illustrated), and can operate (vibrate, transform) based on a signal of the piezoelectric element driving circuit. The diaphragm 1a can be transformed by the operation of the piezoelectric body 30 to change the internal pressure of the pressure chamber 622 as appropriate.

The case 630 can accommodate the nozzle plate 610, the pressure chamber substrate 620, and the piezoelectric element 100 as illustrated in FIG. 3. Mentioned as materials of the case 630 are resin, metal, and the like, for example.

The liquid ejection head 600 at least contains the above-described piezoelectric element 100 that is excellent in voltage resistance. Therefore, the liquid ejection head 600 has high voltage resistance, can operate at a higher voltage as compared with a former case, and has high liquid ejection capability or the like.

Here, the case where the liquid ejection head 600 is an ink jet recording head is described. However, the liquid ejection head of this embodiment can be used as, for example, a color material ejection head for use in manufacturing color filters of a liquid crystal display and the like, an electrode material ejection head for use in forming electrodes of an organic EL display, FED (field emission display), and the like, a biological organic material ejection head for use in manufacturing biochips, and the like.

4. Liquid Ejecting Apparatus

Figure 4:
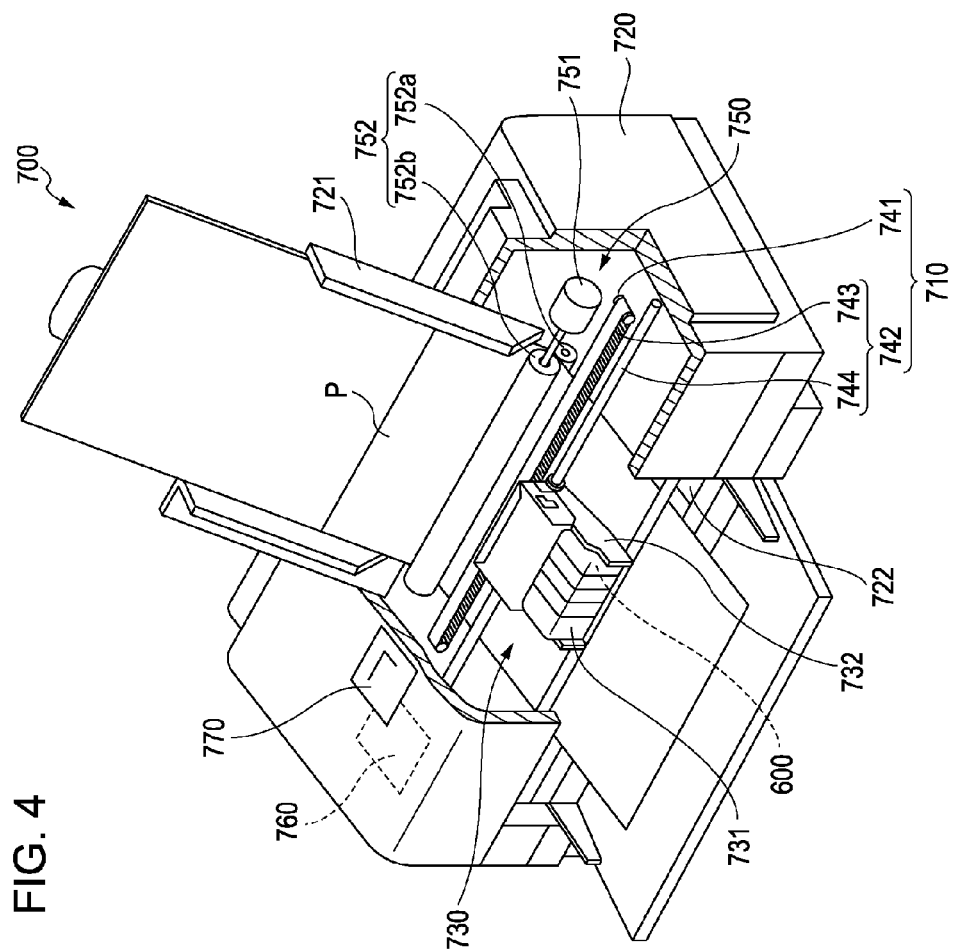
FIG. 4 is a perspective view schematically illustrating a liquid ejecting apparatus according to this embodiment.

Next, a liquid ejecting apparatus 700 according to this embodiment will be described with reference to the drawings. FIG. 4 is a perspective view schematically illustrating the liquid ejecting apparatus 700 according to this embodiment. The liquid ejecting apparatus 700 has the above-described liquid ejection head 600. In the following description, the case where the liquid ejecting apparatus 700 is an ink jet printer having the above-described liquid ejection head 600 will be described.

The liquid ejecting apparatus 700 contains a head unit 730, an actuator 710, and a control unit 760 as illustrated in FIG. 4. The liquid ejecting apparatus 700 can further contain an apparatus main body 720, a paper feed unit 750, a tray 721 on which a recording paper P is placed, an ejection port 722 for ejecting the recording paper P, and an operation panel 770 disposed on the top surface of the apparatus main body 720.

The head unit 730 has an ink jet recording head constituted by the above-described liquid ejection head 600 (hereinafter sometimes simply referred to as a "head"). The head unit 730 further has an ink cartridge 731 that supplies ink to the head and a carriage 732 on which the head and an ink cartridge 731 are mounted.

The actuator 710 can reciprocate the head unit 730. The actuator 710 has a carriage motor 741 serving as the drive source of the head unit 730 and a reciprocating mechanism 742 that reciprocates the head unit 730 in response to the rotation of the carriage motor 741.

The reciprocating mechanism 742 has a carriage guide axis 744 both ends of which are supported by a frame (not illustrated) and a timing belt 743 that extends in parallel to the carriage guide axis 744. The carriage guide axis 744 supports the carriage 732 in such a manner that the carriage 732 can freely reciprocate. Furthermore, the carriage 732 is fixed to a part of the timing belt 743. When the timing belt 743 is made to travel by the operation of the carriage motor 741, the head unit 730 reciprocates while being guided by the carriage guide axis 744. During the reciprocation, ink is ejected from the head as appropriate, and printing to the recording paper P is performed.

In this embodiment, an example of the liquid ejecting apparatus in which printing is performed while both the liquid ejection head 600 and the recording paper P are moving is described. However, the liquid ejecting apparatus of the invention may be a mechanism in which printing to the recording paper P is performed while the liquid ejection head 600 and the recording paper P are mutually and relatively changing the position. In this embodiment, an example in which printing is performed to the recording paper P is described. However, recording media to which printing can be performed by the liquid ejecting apparatus of the invention are not limited to paper and various media, such as cloth, film, and metal, can be mentioned and the structure can be changed as appropriate.

The control unit 760 can control the head unit 730, the actuator 710, and the paper feed unit 750.

The paper feed unit 750 can feed the recording paper P to the head unit 730 side from the tray 721. The paper feed unit 750 has a paper feed motor 751 serving as the drive source thereof and a paper feed roller 752 that rotates by the operation of the paper feed motor 751. The paper feed roller 752 has a follower roller 752a and a driving roller 752b that vertically face each other with a feed path of the recording paper P inserted therebetween. The driving roller 752b is connected to the paper feed motor 751. When the paper feed unit 750 is driven by the control unit 760, the recording paper P is fed in such a manner to pass under the head unit 730.

The head unit 730, the actuator 710, the control unit 760, and the paper feed unit 750 are provided inside the apparatus main body 720.

The liquid ejecting apparatus 700 has the liquid ejection head 600 having high voltage resistance. Therefore, the liquid ejection capability of the liquid ejecting apparatus 700 is high.

The liquid ejecting apparatus 700 described as an example has one liquid ejection head 600 and the liquid ejection head 600 enables printing to a recording medium. The liquid ejecting apparatus 700 may have two or more liquid ejection heads. When the liquid ejecting apparatus has two or more liquid ejection heads, the two or more liquid ejection heads each may be independently operated as described above or the two or more liquid ejection heads may be connected to each other to form one assembled head. Mentioned as such an assembled head is, for example, a line type head in which each nozzle opening of the two or more heads has an interval uniform.

As described above, the liquid ejecting apparatus 700 as an ink jet printer is described as an example of the liquid ejecting apparatus according to the invention. The liquid ejecting apparatus according to the invention can be industrially utilized. Usable as liquid (a liquid material) to be ejected in this case is one obtained by adjusting the viscosity of various kinds of functional materials to a preferable viscosity by a solvent or a dispersion medium. The liquid ejecting apparatus of the invention can be preferably used for, in addition to the image recording device, such as a printer, mentioned above, a color material ejection device for use in manufacturing color filters of a liquid crystal display and the like, a liquid material ejection device for use in forming electrodes or color filters of an organic EL display, FED (field emission display), an electrophoretic display, and the like, a biological organic material ejection device for use in manufacturing biochips, and the like.

5. Examples and Comparative Examples

The invention will be more specifically described below with reference to Examples and Comparative Examples. The invention is not limited at all to the following Examples.

5.1. Production of Piezoelectric Element

Piezoelectric elements of Examples 1 to 5 and Comparative Examples 1 to 3 were produced as follows.

A substrate was produced by the following processes. First, a silicon oxide ($SiO_2$) film having a film thickness of 1000 nm was formed on the surface of a silicon (Si) substrate by thermal oxidation. Next, a zirconium dioxide ($ZrO_2$) film having a film thickness of 400 nm was formed on the $SiO_2$ film by a DC sputtering method and thermal oxidation. Next, a titanium (Ti) film having a film thickness of 20 nm and further a platinum (Pt) film having a film thickness of 130 nm were formed on the $ZrO_2$ film by a DC sputtering method to form a lower electrode layer. This laminate is equivalent to the first conductive layer 10 of the embodiment.

The piezoelectric body 30 of each of the Examples and the Comparative Examples was produced by a chemical solution method. Onto the first conductive layer 10, a BLFM precursor solution was applied by a spin coat method. The precursor solution was produced to have different compositions for each Example and Comparative Example. The rotation rate in spin coating was 1500 rpm.

Next, the applied precursor film was dried at 150° C. for 2 minutes in the air to remove the solvent. Subsequently, the precursor film was heated at 350° C. for 4 minutes in the air to remove the organic ingredients in the precursor film (degreasing). In each of the Examples and the Comparative Examples, a set of the application of the precursor solution, drying, and degreasing was repeatedly performed twice. Subsequently, the precursor film was introduced into a firing furnace (Rapid Thermal Annealing (RTA)), and fired at 650° C. for 2 minutes under nitrogen flow of 0.5 L/min.

Furthermore, a set of the application of the precursor solution, drying, and degreasing was repeated 3 times and firing was repeated twice, and then the film was fired at 650° C. for 5 minutes under nitrogen flow of 0.5 L/min for each of the Examples and the Comparative Examples. Thus, a 500 nm thick piezoelectric body 30 was obtained.

A Pt film having a film thickness of 100 nm was further produced thereon as the second conductive layer 20 by a DC sputtering method. Thereafter, the second conductive layer 20 was introduced into the RTA furnace, and then baked at 650° C. for 5 minutes under nitrogen flow of 0.5 L/min in the furnace, thereby producing a piezoelectric element of each of the Examples and the Comparative Examples.

In each of the Examples and the Comparative Examples, a solution, in which octane, xylene, and n-butanol were used as a solvent to an organic acid salt of bismuth, a lantern, iron, and manganese, was used as the precursor solution in the chemical solution method. With respect to the composition of the BLFM precursor solution, the compounding ratio (ratio of the charge amount (mol %)) of each element in the raw materials in Table 1 was indicated as the concentration of the elements contained in the raw material solution for each of the Examples and the Comparative Examples. Table 1 also shows the coefficient ratio represented using the coefficients of w, x, y, and z when represented in the form of Formula (I) above in each of the Example and the Comparative Example.

TABLE 1

|  |  | Compounding ratio | | | | Coefficient ratio | | |
|---|---|---|---|---|---|---|---|---|
|  |  | Bi | La | Fe | Mn | (w + x)/(y + z) | w/x | z/(y + z) |
| Examples | 1 | 0.75 | 0.19 | 0.97 | 0.03 | 0.94 | 3.947 | 0.03 |
|  | 2 | 0.68 | 0.19 | 0.97 | 0.03 | 0.87 | 3.578 | 0.03 |
|  | 3 | 0.75 | 0.19 | 0.98 | 0.02 | 0.94 | 3.947 | 0.02 |
|  | 4 | 0.75 | 0.19 | 0.96 | 0.04 | 0.94 | 3.947 | 0.04 |
|  | 5 | 0.77 | 0.16 | 0.97 | 0.03 | 0.93 | 4.812 | 0.03 |
| Comparative | 1 | 0.81 | 0.19 | 0.97 | 0.03 | 1.00 | 4.263 | 0.03 |
| Examples | 2 | 0.58 | 0.19 | 0.97 | 0.03 | 0.77 | 3.052 | 0.03 |
|  | 3 | 0.81 | 0.16 | 0.97 | 0.03 | 0.97 | 5.062 | 0.03 |

5.2. Evaluation of Piezoelectric Element

The piezoelectric element of each of the Examples and Comparative Examples was measured and evaluated for the current-voltage characteristics. A given voltage was applied between the first conductive layer and the second conductive layer of the piezoelectric element, and then a current flowing between the first conductive layer and the second conductive layer when the given voltage was applied was measured. The applied voltage was plotted on the horizontal axis and the current density was plotted on the vertical axis, and then the current-voltage characteristics were evaluated.

Figure 5:
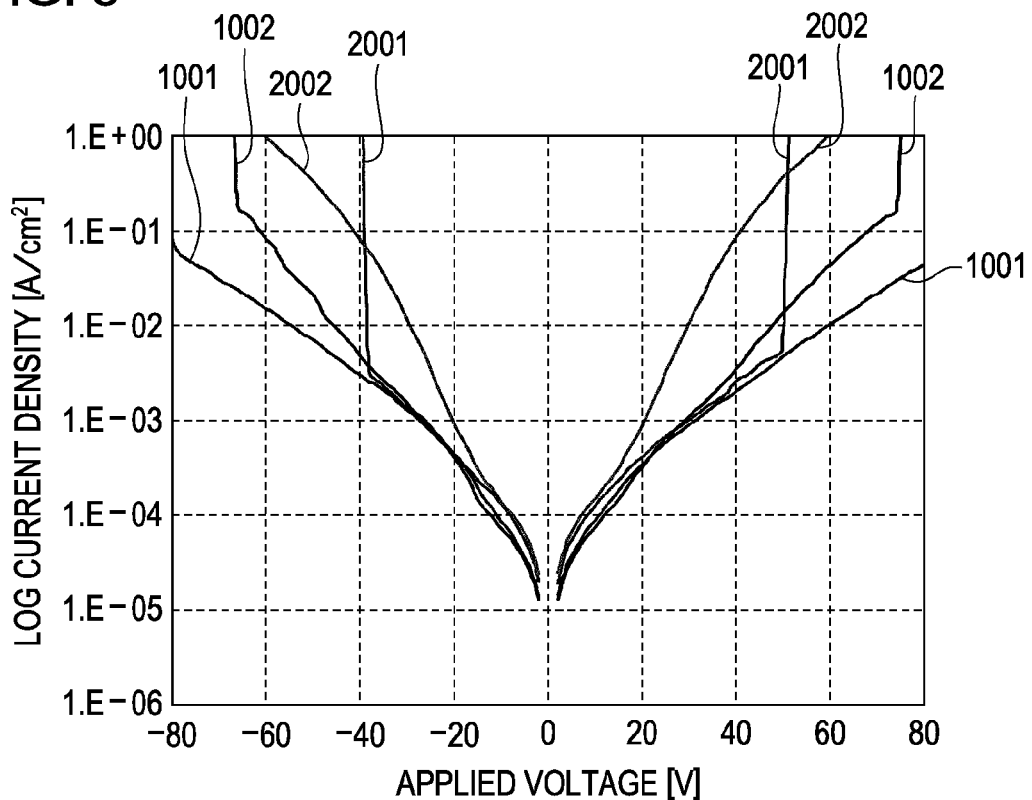
FIG. 5 is a graph showing the current-voltage characteristics of piezoelectric elements of Example 1, Example 2, Comparative Example 1, and Comparative Example 2.
Figure 6:
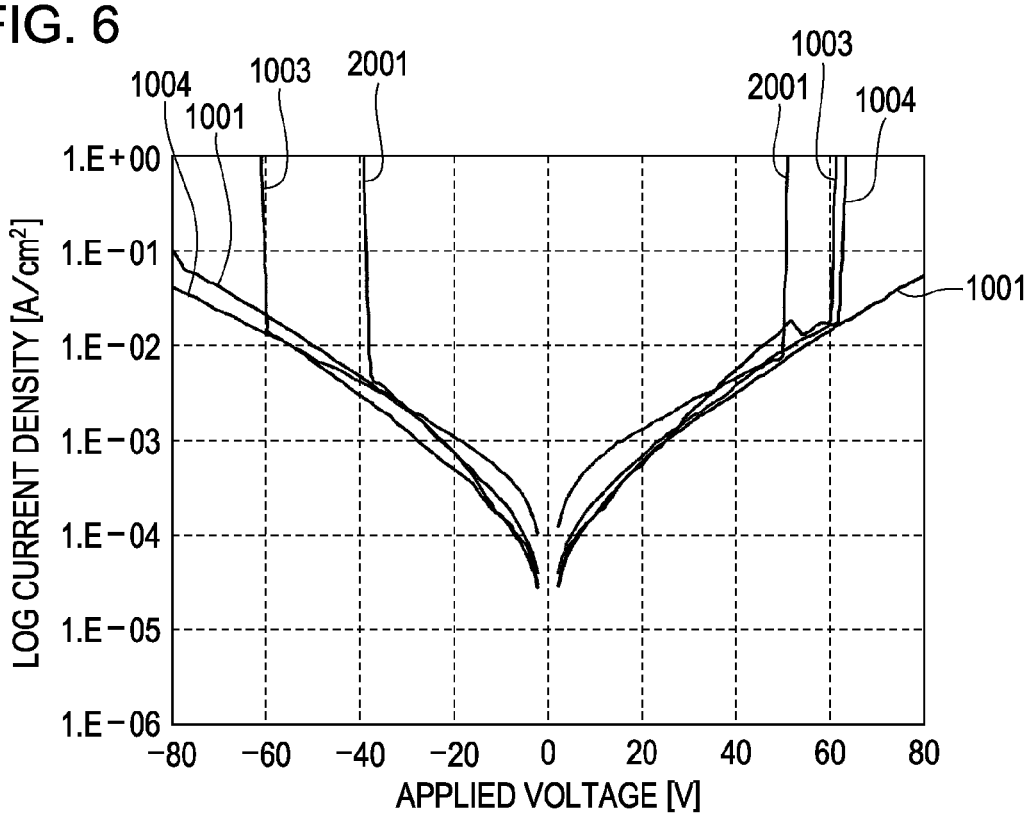
FIG. 6 is a graph showing the current-voltage characteristics of piezoelectric elements of Example 1, Example 3, Example 4, and Comparative Example 1.
Figure 7:
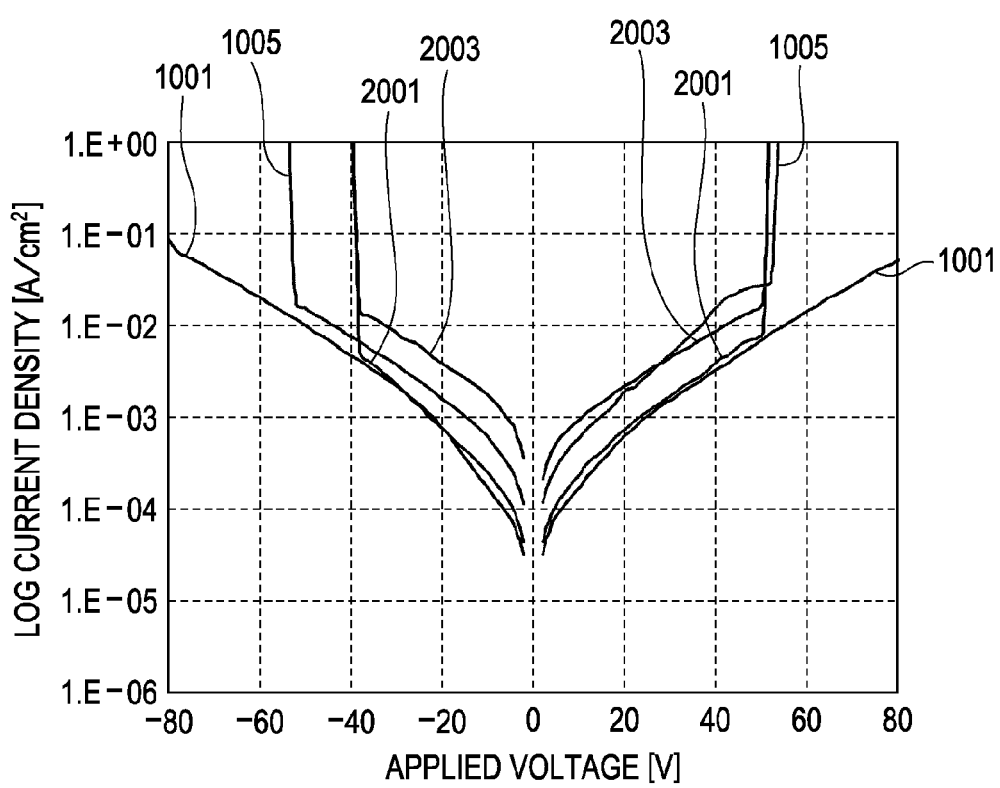
FIG. 7 is a graph showing the current-voltage characteristics of piezoelectric elements of Example 1, Example 5, Comparative Example 1, and Comparative Example 3.

FIG. 5 is a graph showing the current-voltage characteristics of the piezoelectric elements of Example 1 (1001), Example 2 (1002), Comparative Example 1 (2001), and Comparative Example 2 (2002). FIG. 6 is a graph showing the current-voltage characteristics of the piezoelectric elements of Example 1 (1001), Example 3 (1003), Example 4 (1004), and Comparative Example 1 (2001). FIG. 7 is a graph showing the current-voltage characteristics of the piezoelectric elements of Example 1 (1001), Example 5 (1005), Comparative Example 1 (2001), and Comparative Example 3 (2003). In all the graphs, the horizontal axis represents the applied voltage [V] represented on the linear scale and the vertical axis represents the current density [A/cm$^2$] represented on the log scale.

FIG. 5 is a graph showing the comparison of the current-voltage characteristics of the piezoelectric elements in which the compounding ratio of La, Fe, and Mn was fixed and the compounding ratio of Bi was changed. As shown in FIG. 5, it was revealed that, comparing with the fact that the piezoelectric element having a stoichiometric composition of Comparative Example 1 (2001) causes dielectric breakdown at about 50 V, the piezoelectric element of Example 1 (1001) does not cause dielectric breakdown before about 80 V and the piezoelectric element of Example 2 (1002) does not cause dielectric breakdown before about 72 V. More specifically, it was revealed that the piezoelectric element of Example 1 (1001) and the piezoelectric element of Example 2 (1002) have favorable voltage resistance as compared with the piezoelectric element of Comparative Example 1. It was also revealed that, in the piezoelectric element of Comparative Example 2 (2002), the leakage current density remarkably increases as compared with the piezoelectric element of Comparative Example 1.

FIG. 6 is a graph showing the comparison of the current-voltage characteristics of the piezoelectric elements in which the compounding ratio of Bi and La was fixed and the compounding ratio of Fe and Mn was changed and the piezoelectric element of Comparative Example 1. As shown in FIG. 6, it was revealed that the piezoelectric element of Example 3 (1003) does not cause dielectric breakdown before about 60 V and the piezoelectric element of Example 4 (1004) does not cause dielectric breakdown before about 62 V. More specifically, it was revealed that the piezoelectric element of Example 3 (1003) and the piezoelectric element of Example 4 (1004) have favorable voltage resistance as compared with the piezoelectric element of Comparative Example 1.

FIG. 7 is a graph showing the comparison of the current-voltage characteristics of the piezoelectric elements in which the compounding ratio of the sum of Bi and La is lower than the stoichiometric composition and the piezoelectric element of Comparative Example 1 having a stoichiometric composition. As shown in FIG. 7, it was revealed that the piezoelectric element of Example 5 (1005) does not cause dielectric breakdown before about 52 V. More specifically, it was revealed that the piezoelectric element of Example 5 (1005) has favorable voltage resistance as compared with the piezoelectric element of Comparative Example 1. In contrast, it was revealed that the piezoelectric element of Comparative Example 3 (2003) causes dielectric breakdown at about 50 V similarly as in the piezoelectric element of Comparative Example 1 (2001) and the leakage current density increases as compared with the piezoelectric element of Comparative Example 1 (2001).

The Examples and the Comparative Examples above showed that a piezoelectric body having a favorable voltage resistance can be obtained using BLFM.

With respect to the embodiments and the modifications described above, arbitrary two or more aspects can be combined as appropriate. Thus, the combined embodiments can demonstrate the effects of the respective embodiments or the synergistic effects thereof.

The invention is not limited to the embodiments described above and can be further modified in various manners. For example, the invention includes the substantially same structure (e.g., a structure having the same functions, methods, and results or a structure having the same objects and effects) as the structure described in the embodiments. The invention includes a structure in which non-essential portions of the structure described in the embodiments are replaced. Moreover, the invention includes a structure that can demonstrate the same effects as those in the structure described in the embodiments or a structure that can achieve the same objects as those in the structure described in the embodiments. Moreover, the invention includes a structure in which known techniques are added to the structure described in the embodiments.

What is claimed is:

1. A piezoelectric element, comprising:
   electrodes; and
   a piezoelectric body formed between the electrodes, wherein
   the piezoelectric body consists of a perovskite oxide including bismuth, lantern, iron and manganese;
   the molar ratio of the sum of the bismuth and the lantern to the sum of the iron and the manganese (Bi+La/Fe+Mn) is 0.87 or more and 0.94 or less; and
   the molor ratio of the bismuth to the lantern (Bi/La) is 3.57 or more and 4.82 or less.

2. The piezoelectric element according to claim 1, wherein the molar ratio of the manganese to the sum of the iron and the manganese (Mn/Fe+Mn) is 0.02 or more and 0.04 or less.

3. A liquid ejection head, comprising the piezoelectric element according to claim 1.

4. A liquid ejecting apparatus comprising the liquid ejection head according to claim 3.

* * * * *